United States Patent
Du et al.

(10) Patent No.: US 11,210,028 B2
(45) Date of Patent: Dec. 28, 2021

(54) METHOD FOR ACCESSING FLASH MEMORY MODULE AND ASSOCIATED FLASH MEMORY CONTROLLER AND ELECTRONIC DEVICE

(71) Applicant: Silicon Motion, Inc., Hsinchu County (TW)

(72) Inventors: Jian-Dong Du, Taoyuan (TW); Pi-Ju Tsai, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/856,008

(22) Filed: Apr. 22, 2020

(65) Prior Publication Data

US 2021/0334039 A1    Oct. 28, 2021

(51) Int. Cl.
  *G06F 3/06*     (2006.01)
  *G11C 11/56*    (2006.01)
  *G11C 16/04*    (2006.01)
  *G11C 16/26*    (2006.01)

(52) U.S. Cl.
  CPC .......... *G06F 3/0659* (2013.01); *G06F 3/0604* (2013.01); *G06F 3/0679* (2013.01); *G11C 11/5642* (2013.01); *G11C 16/0483* (2013.01); *G11C 16/26* (2013.01)

(58) Field of Classification Search
  CPC .... G06F 3/0659; G06F 3/0679; G06F 3/0604; G11C 16/26; G11C 11/5642; G11C 16/0483

USPC ........................................................ 711/103
See application file for complete search history.

(56) References Cited

U.S. PATENT DOCUMENTS

| | | | |
|---|---|---|---|
| 2012/0066438 A1* | 3/2012 | Yoon .................. | G06F 12/0246 711/103 |
| 2016/0266968 A1* | 9/2016 | Torii .................. | G06F 11/1012 |
| 2017/0200510 A1* | 7/2017 | Hung ..................... | G11C 29/52 |
| 2020/0293398 A1* | 9/2020 | Symons ............. | H03M 13/1102 |

* cited by examiner

*Primary Examiner* — Amir Zarabian
*Assistant Examiner* — Minh Dinh
(74) *Attorney, Agent, or Firm* — Winston Hsu

(57) ABSTRACT

The present invention discloses a method for accessing a flash memory module, wherein the flash memory module comprises a plurality of block, each block is implemented by a plurality of word lines, and each word line comprises a plurality of memory cells supporting a plurality of states. The method comprises the steps of: reading the memory cells of at least a first word line of a specific block of the plurality of blocks to obtain a cumulative distribution information of the states of the memory cells; determining a target decoding flow selected from at least a first decoding flow and a second decoding flow according to the cumulative distribution information; reading the memory cells of a second word line to obtain readout information of the second word line; and using the target decoding flow to decode the readout information of the second word line.

20 Claims, 7 Drawing Sheets

METHOD FOR ACCESSING FLASH MEMORY MODULE AND ASSOCIATED FLASH MEMORY CONTROLLER AND ELECTRONIC DEVICE

BACKGROUND OF THE INVENTION

1. Field of the Invention

The present invention relates to flash memory, and more particularly, to a method for accessing a flash memory module and associated flash memory controller.

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the Universal Flash Storage (UFS) and embedded Multi Media Card (eMMC) specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories have been applied to the memory devices, there are some problems such as an increased bit error rate, etc. Although a traditional sensing scheme regarding reading data from the TLC flash memories has been proposed to try solving the problems, it does not work for the memory devices equipped with the quadruple level cell (QLC) flash memories. More particularly, the traditional sensing scheme is not good for high-level per memory cell in the QLC flash memories. Thus, an efficient reading mechanism and associated decoding method are needed for enhancing overall performance without introducing any side effect or in a way that is less likely to introduce a side effect.

SUMMARY OF THE INVENTION

It is therefore an objective of the present invention to provide a method for accessing a flash memory module, which can effectively decode readout information from the flash memory module, to solve the above-mentioned problems.

According to one embodiment of the present invention, a method for accessing a flash memory module is disclosed, wherein the flash memory module comprises at least one flash memory chip, each flash memory chip comprises a plurality of block, each block is implemented by a plurality of word lines, each word line corresponds to a plurality of pages, and each word line comprises a plurality of memory cells supporting a plurality of states. The method comprises the steps of: reading the memory cells of at least a first word line of a specific block of the plurality of blocks to obtain a cumulative distribution information of the states of the memory cells; determining a target decoding flow selected from at least a first decoding flow and a second decoding flow according to the cumulative distribution information, wherein the first decoding flow and the second decoding flow have different decoding methods or different decoding orders; reading the memory cells of a second word line to obtain readout information of the second word line; and using the target decoding flow to decode the readout information of the second word line.

According to another embodiment of the present invention, a flash memory controller is disclosed, wherein the flash memory controller is coupled to a flash memory module, the flash memory module comprises at least one flash memory chip, each flash memory chip comprises a plurality of block, each block is implemented by a plurality of word lines, each word line corresponds to a plurality of pages, and each word line comprises a plurality of memory cells supporting a plurality of states. The flash memory controller comprises a memory, a microprocessor and a decoder. The memory is configured to store a program code. The microprocessor is configured to execute the program code to access the flash memory module via a control logic circuit. In addition, the microprocessor reads the memory cells of at least a first word line of a specific block of the plurality of blocks to obtain a cumulative distribution information of the states of the memory cells, and the microprocessor determines a target decoding flow selected from at least a first decoding flow and a second decoding flow according to the cumulative distribution information, wherein the first decoding flow and the second decoding flow have different decoding methods or different decoding orders; and the microprocessor further reads the memory cells of a second word line to obtain readout information of the second word line, and the decoder uses the target decoding flow to decode the readout information of the second word line.

According to another embodiment of the present invention, an electronic device comprising a flash memory controller and a flash memory module is disclosed. The flash memory module comprises at least one flash memory chip, each flash memory chip comprises a plurality of block, each block is implemented by a plurality of word lines, each word line corresponds to a plurality of pages, and each word line comprises a plurality of memory cells supporting a plurality of states. In the operations of the electronic device, the flash memory controller reads the memory cells of at least a first word line of a specific block of the plurality of blocks to obtain a cumulative distribution information of the states of the memory cells, and the flash memory controller determines a target decoding flow selected from at least a first decoding flow and a second decoding flow according to the cumulative distribution information, wherein the first decoding flow and the second decoding flow have different decoding methods or different decoding orders; and the flash memory controller further reads the memory cells of a second word line to obtain readout information of the second word line, and the flash memory controller uses the target decoding flow to decode the readout information of the second word line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
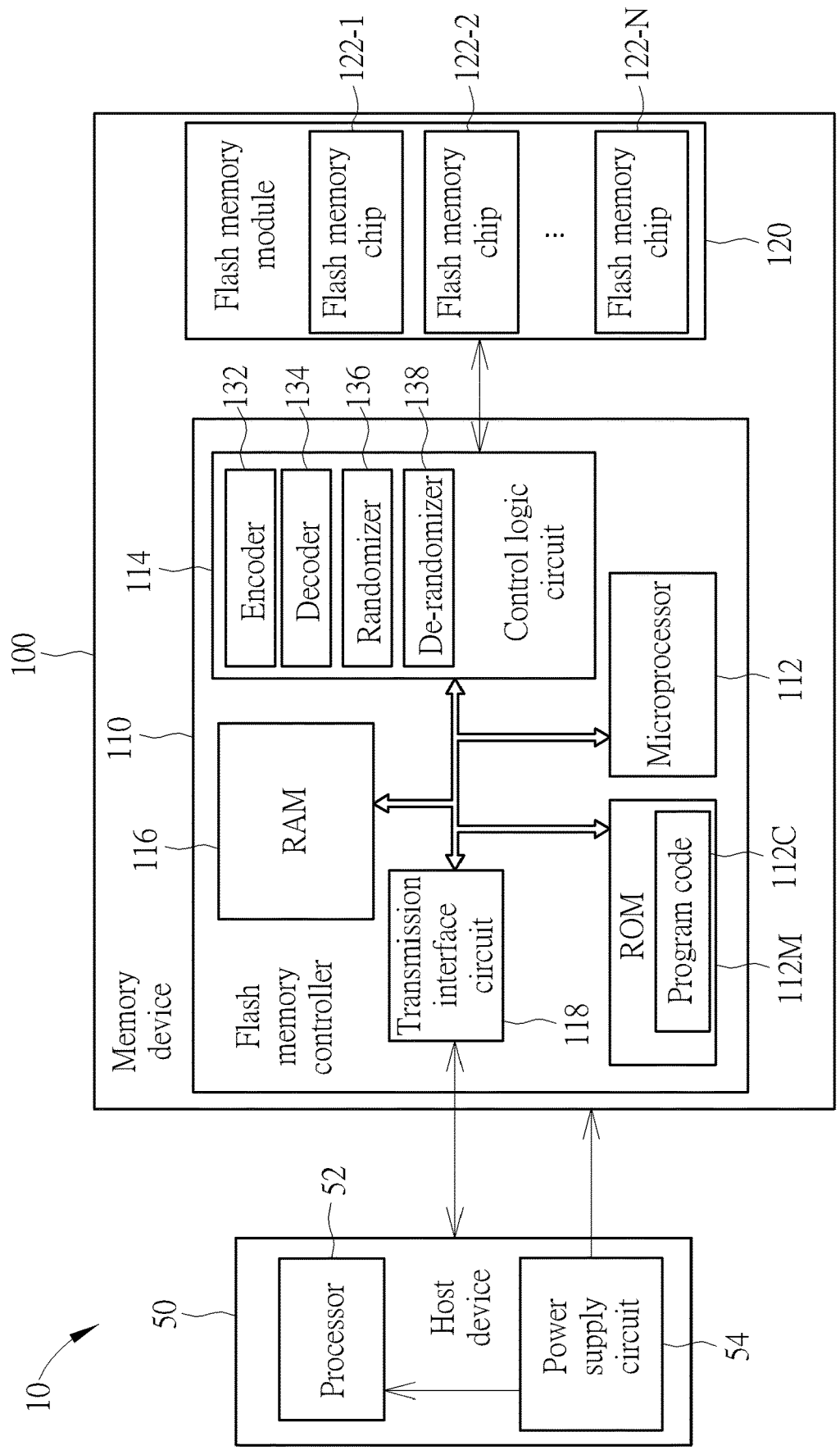
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, ..., and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the flash memory module 120 with the operating commands to perform reading, writing/programing, etc. on memory units (e.g. data pages) having physical addresses within the flash memory module 120, where the physical addresses correspond to the logical addresses. When the flash memory controller 110 perform an erase operation on any flash memory chip 122-$n$ of the plurality of NV memory elements 122-1, 122-2, ..., and 122-N (in which "n" may represent any integer in the interval [1, N]), at least one block of multiple blocks of the flash memory chip 122-$n$ may be erased, where each block of the blocks may comprise multiple pages (e.g. data pages), and an access operation (e.g. reading or writing) may be performed on one or more pages.

Figure 2:
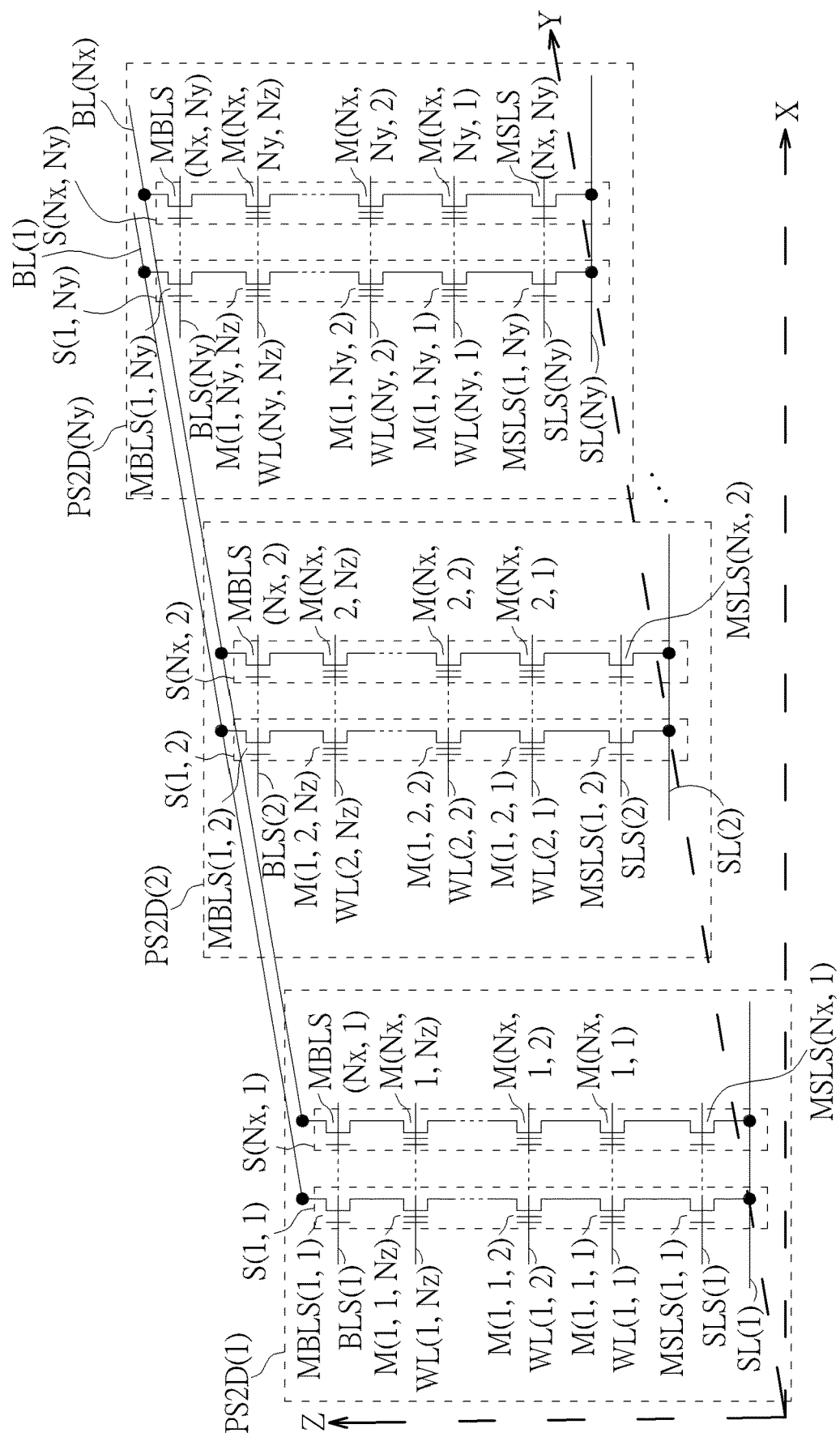
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one of the flash memory chips 122-1, 122-2, ..., and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), ..., M(Nx, 1, 1)}, {M(1, 2, 1), ..., M(Nx, 2, 1)}, ..., {M(1, Ny, 1), ..., M(Nx, Ny, 1)}}, {{M(1, 1, 2), ..., M(Nx, 1, 2)}, {M(1, 2, 2), ..., M(Nx, 2, 2)}, ..., {M(1, Ny, 2), ..., M(Nx, Ny, 2)}}, ..., and {{M(1, 1, Nz), . . . , M(Nx, 1, Nz)}, {M(1, 2, Nz), . . . , M(Nx, 2, Nz)}, . . . , {M(1, Ny, Nz), . . . , M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), . . . , MBLS(Nx, 1)}, {MBLS(1, 2), . . . , MBLS(Nx, 2)}, . . . , and {MBLS(1, Ny), . . . , MBLS(Nx, Ny)} that are arranged in an upper layer above the Nz layers and (Nx*Ny) lower selector circuits {MSLS(1, 1), . . . , MSLS(Nx, 1)}, {MSLS(1, 2), . . . , MSLS(Nx, 2)}, . . . , and {MSLS(1, Ny), . . . , MSLS(Nx, Ny)} that are arranged in a lower layer below the Nz layers. In addition, the 3D NAND flash memory may comprise a plurality of bit lines and a plurality of word lines for access control, such as Nx bit lines BL(1), . . . , and BL(Nx) that are arranged in a top layer above the upper layer and (Ny*Nz) word lines {WL(1, 1), WL(2, 1), . . . , WL(Ny, 1)}, {WL(1, 2), WL(2, 2), . . . , WL(Ny, 2)}, . . . , and {WL(1, Nz), WL(2, Nz), . . . , WL(Ny, Nz)} that are respectively arranged in the Nz layers. Additionally, the 3D NAND flash memory may comprise a plurality of selection lines for selection control, such as Ny upper selection lines BLS(1), BLS(2), . . . , and BLS(Ny) that are arranged in the upper layer and Ny lower selection lines SLS(1), SLS(2), . . . , and SLS(Ny) that are arranged in the lower layer, and may further comprise a plurality of source lines for providing reference levels, such as Ny source lines SL(1), SL(2), . . . , and SL(Ny) that are arranged in a bottom layer below the lower layer.

As shown in FIG. 2, the 3D NAND flash memory may be divided into Ny circuit modules PS2D(1), PS2D(2), . . . , and PS2D(Ny) distributed along the Y-axis. For better comprehension, the circuit modules PS2D(1), PS2D(2), . . . , and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), . . . , and PS2D(Ny) may comprise Nx secondary circuit modules S(1, ny), . . . , and S(Nx, ny), where "ny" may represent any integer in the interval [1, Ny]. For example, the circuit module PS2D(1) may comprise Nx secondary circuit modules S(1, 1), . . . , and S(Nx, 1), the circuit module PS2D(2) may comprise Nx secondary circuit modules S(1, 2), . . . , and S(Nx, 2), . . . , and the circuit module PS2D(Ny) may comprise Nx secondary circuit modules S(1, Ny), . . . , and S(Nx, Ny). In the circuit module PS2D(ny), any secondary circuit module S(nx, ny) of the secondary circuit modules S(1, ny), . . . , and S(Nx, ny) may comprise Nz memory cells M(nx, ny, 1), M(nx, ny, 2), . . . , and M(nx, ny, Nz), and may comprise a set of selector circuits corresponding to the memory cells M(nx, ny, 1), M(nx, ny, 2), . . . , and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), . . . , and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), . . . , and M(nx, ny, Nz) may be implemented with a floating gate transistor, where "nz" may represent any integer in the interval [1, Nz], but the present invention is not limited thereto. Further, the upper selector circuits MBLS(1, ny), . . . , and MBLS(Nx, ny) in the circuit module PS2D(ny) may perform selection according to the selection signal on the corresponding selection line BLS(ny), and the lower selector circuits MSLS(1, ny), . . . , and MSLS(Nx, ny) in the circuit module PS2D(ny) may perform selection according to the selection signal on the corresponding selection line SLS(ny).

In the flash memory module 120, when the block of any one of the flash memory chips 122-1-122-N serves as a single-level cell (SLC) block, each of the physical pages within the block correspond to one logical page, that is each of the memory cells of the page is configured to store only one bit, wherein one physical page may comprise all of the transistors controlled by a word line(e.g. the memory cells M(1,1, Nz)-M(Nx, 1, Nz) corresponding to the word line WL(1, Nz) form a physical page). When the block of any one of the flash memory chips 122-1-122-N serves as an multiple-level cell (MLC) block, each of the physical pages within the block correspond to two logical pages, that is each of the memory cells of the page is configured to store two bits. When the block of any one of the flash memory chips 122-1-122-N serves as a triple-level cell (TLC) block, each of the physical pages within the block correspond to three logical pages, that is each of the memory cells of the page is configured to store three bits. When the block of any one of the flash memory chips 122-1-122-N serves as a quad-level cell (QLC) block, each of the physical pages within the block correspond to four logical pages, that is each of the memory cells of the page is configured to store four bits.

Figure 3:
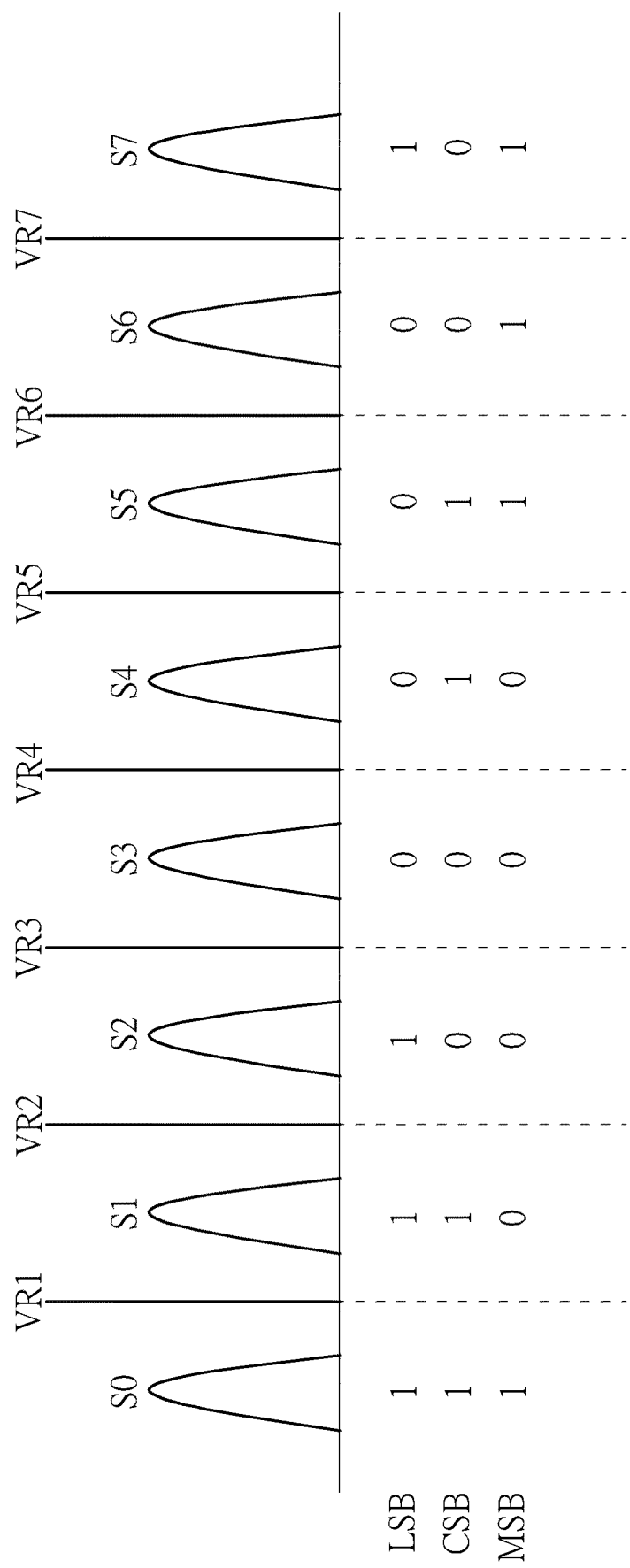
FIG. 3 is a diagram illustrating a plurality of states (program states) of a memory cell of the TLC block according to one embodiment of the present invention.

FIG. 3 is a diagram illustrating a plurality of states (program states) of a memory cell of the TLC block according to one embodiment of the present invention. As shown in FIG. 3, each memory cell can have eight states, and each state represents different combinations of three bits that are named as a least significant bit (LSB), a middle significant bit (MSB) and a most significant bit (MSB). In the embodiment shown in FIG. 3, when the memory cell is programmed to have the state S0, the LSB, the CSB and the MSB stored in the memory cell are (1, 1, 1); when the memory cell is programmed to have the state S1, the LSB, the CSB and the MSB stored in the memory cell are (1, 1, 0); when the memory cell is programmed to have the state S2, the LSB, the CSB and the MSB stored in the memory cell are (1, 0, 0); when the memory cell is programmed to have the state S3, the LSB, the CSB and the MSB stored in the memory cell are (0, 0, 0); when the memory cell is programmed to have the state S4, the LSB, the CSB and the MSB stored in the memory cell are (0, 1, 0); when the memory cell is programmed to have the state S5, the LSB, the CSB and the MSB stored in the memory cell are (0, 1, 1); when the memory cell is programmed to have the state S6, the LSB, the CSB and the MSB stored in the memory cell are (0, 0, 1); and when the memory cell is programmed to have the state S1, the LSB, the CSB and the MSB stored in the memory cell are (1, 0, 1).

When the LSB is required to be read by the flash memory controller 110, the flash memory controller 110 can control the flash memory module 120 to apply two read voltages VR3 and VR7 to read the memory cell. If the memory cell is conductive when the read voltage VR7 is applied or the memory cell is not conductive when the read voltage VR3, the LSB is determined to be "1"; if the memory cell is not conductive when the read voltage VR7 is applied, and the memory cell is conductive when the read voltage VR3 is applied, the LSB is determined to be "0". When the CSB is required to be read by the flash memory controller 110, the flash memory controller 110 can control the flash memory module 120 to apply three read voltages VR2, VR4 and VR6 to read the memory cell. If the memory cell is not conductive when the read voltage VR2 is applied, the CSB is determined to be "1"; if the memory cell is not conductive when the read voltage VR4 is applied, and the memory cell is conductive when the read voltage VR2 is applied, the CSB is determined to be "0"; if the memory cell is not conductive when the read voltage VR6 is applied, and the memory cell is conductive when the read voltage VR4 is applied, the CSB is determined to be "1"; and if the memory cell is conductive when the read voltage VR6 is applied, the CSB is determined to be "0". When the MSB is required to be read by the flash memory controller 110, the flash memory controller 110 can control the flash memory module 120 to apply two read voltages VR1 and VR5 to read the memory cell. If the memory cell is conductive when the read voltage VR5 is applied or the memory cell is not conductive when the read voltage VR1, the LSB is determined to be "1"; if the memory cell is not conductive when the read voltage VR5 is applied, and the memory cell is conductive when the read voltage VR1 is applied, the LSB is determined to be "0".

In the embodiment shown in FIG. 3, the LSBs of the memory cells of a single word line form a LSB page (logical page), the CSBs of the memory cells of the single word line form a CSB page (logical page), and the MSBs of the memory cells of the single word line form the MSB page (logical page). That is, each word line of the TLC block has three pages: the LSB page, the CSB page and the MSB page.

It is noted that the gray code shown in FIG. 3 is for illustratively only, and it's not a limitation of the present invention. Any suitable gray code can be used in the memory device 100, and the read voltages for determining the LSB, the CSB and the MSB may be changed accordingly.

Figure 4:
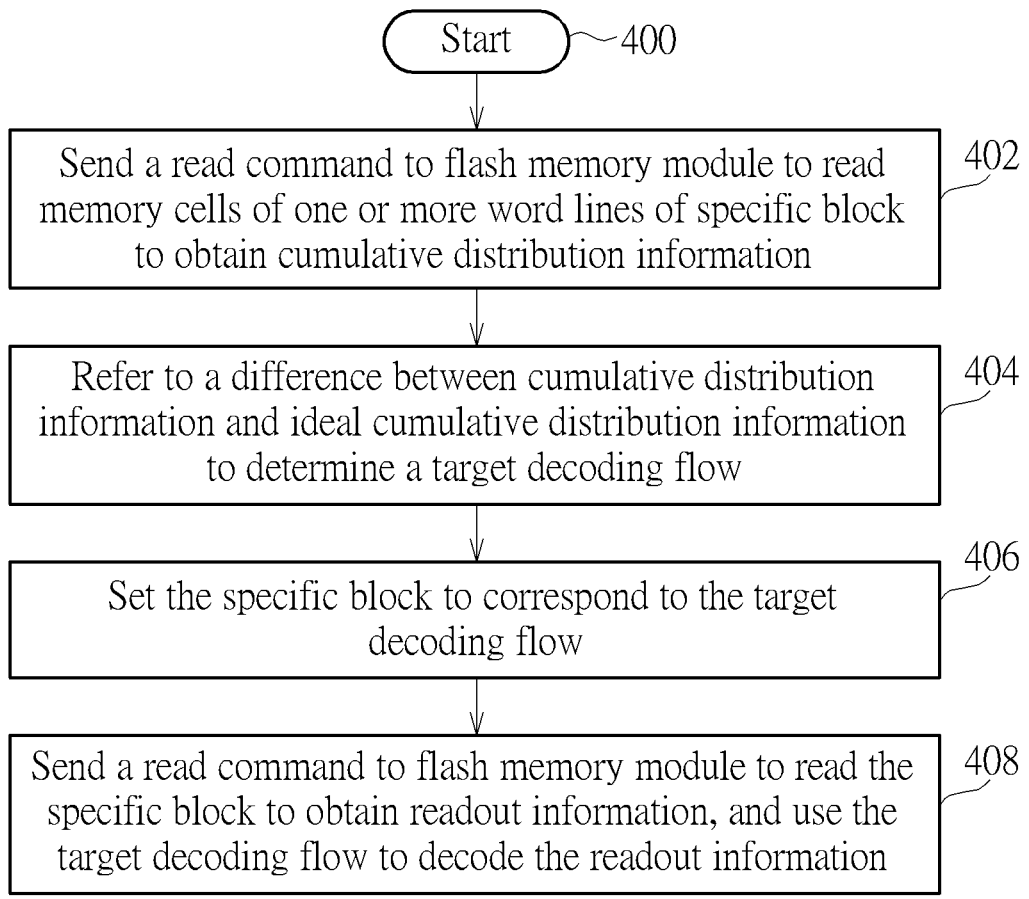
FIG. 4 is a flowchart of a method for accessing flash memory module according to one embodiment of the present invention.

FIG. 4 is a flowchart of a method for accessing the flash memory module 120 according to one embodiment of the present invention. In Step 400, the flow starts, and the memory device 100 is powered on. In Step 402, the microprocessor 112 of the flash memory controller 110 sends a read command to read all of pages of one or more word line(s) of a specific block, that is to read memory cells of the word line(s) of the specific block to obtain a cumulative distribution information of the states of the memory cells. In this embodiment, quantity of the word lines to be read may be one or two that is much smaller than the total word lines within the specific block. For example, assuming that the specific block is a TLC block, the flash memory module 120 may use all of the read voltages VR1-V7 to read each memory cell of the word line(s) to obtain the state of each memory cell, and send readout information to the flash memory controller 110. After receiving the readout information from the flash memory module 120, the control logic circuit 114 establishes a cumulative distribution information of the states of the memory cells of the word line(s). In one embodiment, the cumulative distribution information comprises cumulative number/ratio of each state, and the cumulative number/ratio of one of the states comprises the number/ratio of the states whose corresponding programmed voltage is equal to and less than the programmed voltage of the one of the states. Taking FIG. 5 as an example, assuming that there are ten-thousand memory cells are read, the numbers of the memory cells having the states S0-S7 are '800', '1000', '1000', '1200', '1200', '1500', '1500' and '1800', that is the ratio of the states S0-S7 are '0.08', '0.1', '0.1', '0.12', '0.12', '0.15', '0.15' and '0.18', respectively, the control logic circuit 114 can establish a cumulative distribution function shown in FIG. 5 as the cumulative distribution information.

Figure 5:
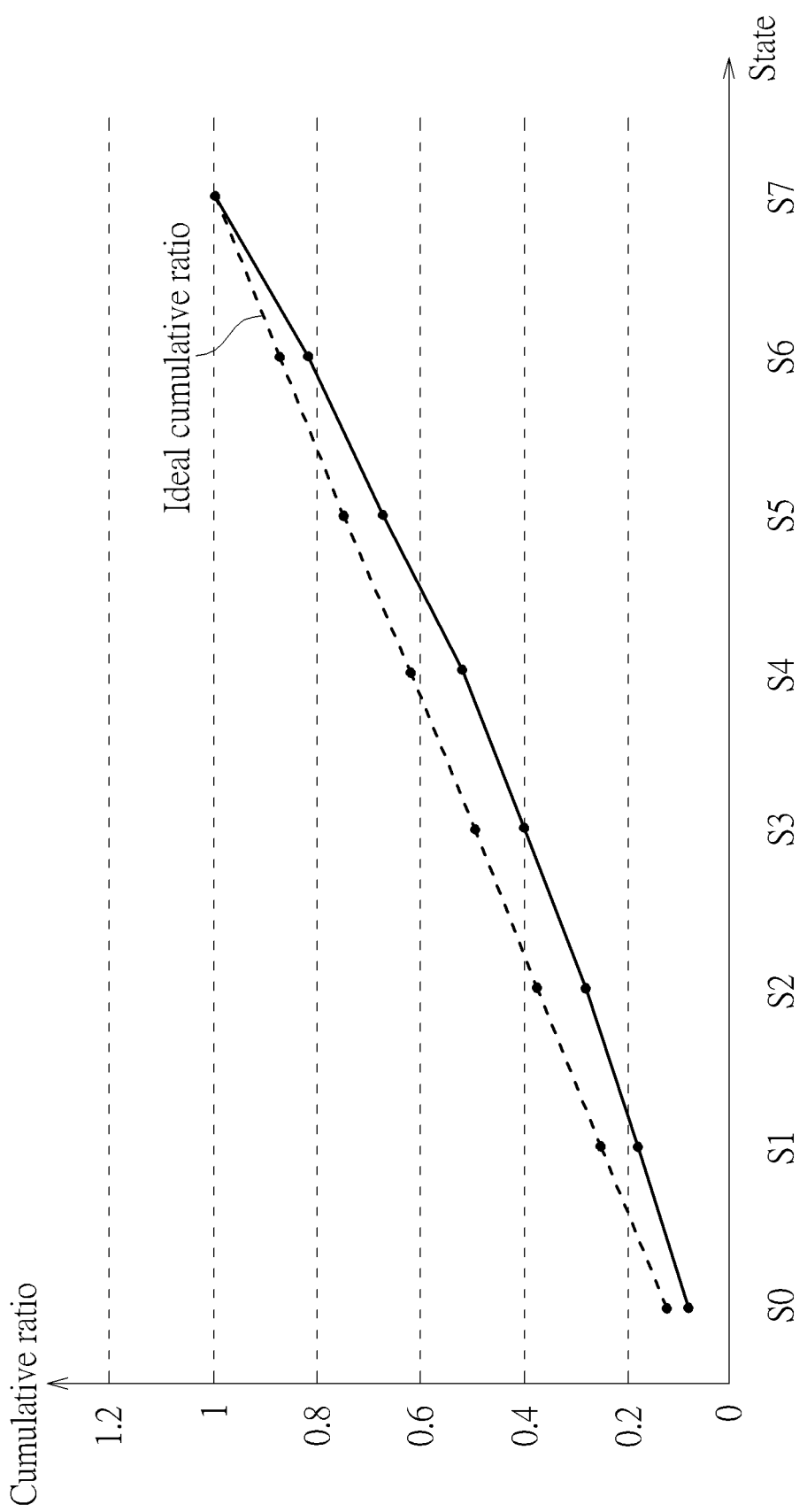
FIG. 5 shows cumulative distribution information and ideal cumulative distribution information.

In Step 404, the microprocessor 112 or the control logic circuit 114 refers to a difference between the cumulative distribution information and ideal cumulative distribution information to determine a target decoding flow selected from one of a first decoding flow, a second decoding flow and a third decoding flow. In this embodiment, because the data written into the flash memory module 120 are randomized by the randomizer 136, ideally the memory cells having any two of the states S0-S7 should be much close to each other. For example, assuming that there are ten-thousand memory cells are read, ideally the memory cells having each of the states S0-S7 should be close to '1250' (i.e. (10000/8)=1250), and a dotted line shown in FIG. 5 is the ideal cumulative distribution information. In one embodiment, the first decoding flow comprising a hard decoding method, a soft decoding method and a redundant array of independent disks (RAID) decoding method, the second decoding flow comprises the soft decoding method and the RAID decoding method without the hard decoding method, and the third decoding flow comprises the RAID decoding method without the hard decoding method and the soft decoding method; and if the difference is lower than a first degree, the microprocessor 112 or the control logic circuit 114 selects the first decoding flow as the target decoding flow; if the difference is greater than a second degree, the microprocessor 112 or the control logic circuit 114 selects the third decoding flow as the target decoding flow, wherein second degree is greater than the second degree; and if the difference is between the first degree and the second degree, the microprocessor 112 or the control logic circuit 114 selects the second decoding flow as the target decoding flow. It is noted that the above-mentioned "difference between the cumulative distribution information and the ideal cumulative distribution information" can be a mean square error or any other parameter capable of representing an error of the cumulative distribution information, and the first degree may be a threshold value indicating lower error of the cumulative distribution information, and the second degree may be a threshold value indicating greater error of the cumulative distribution information.

In Step 406, the microprocessor 112 or the control logic circuit 114 sets the specific block to corresponding to the determined target decoding flow. For example, the microprocessor 112 or the control logic circuit 114 may establish a table, wherein the table records at least part of the blocks within the flash memory module 120 and the corresponding decoding flow. For example, one block whose cumulative distribution information is close to the ideal cumulative distribution information may correspond to the first decoding flow comprising the hard decoding method, the soft decoding method and the RAID decoding method, and another block whose cumulative distribution information is far away from the ideal cumulative distribution information may correspond to the third decoding flow comprising the RAID decoding method only.

In Step 408, if the flash memory controller 110 receives a read command from the host device 50 to ask for the data stored in the specific block, the flash memory controller 110 may refer to the target decoding flow determined in Step 406, to notify the flash memory module 120 to use the appropriate read mechanism to generate readout information of page(s) of the word line(s), and the flash memory controller 110 receives the readout information from the flash memory module 120 and uses the target decoding flow to decode the readout information.

Figure 6:
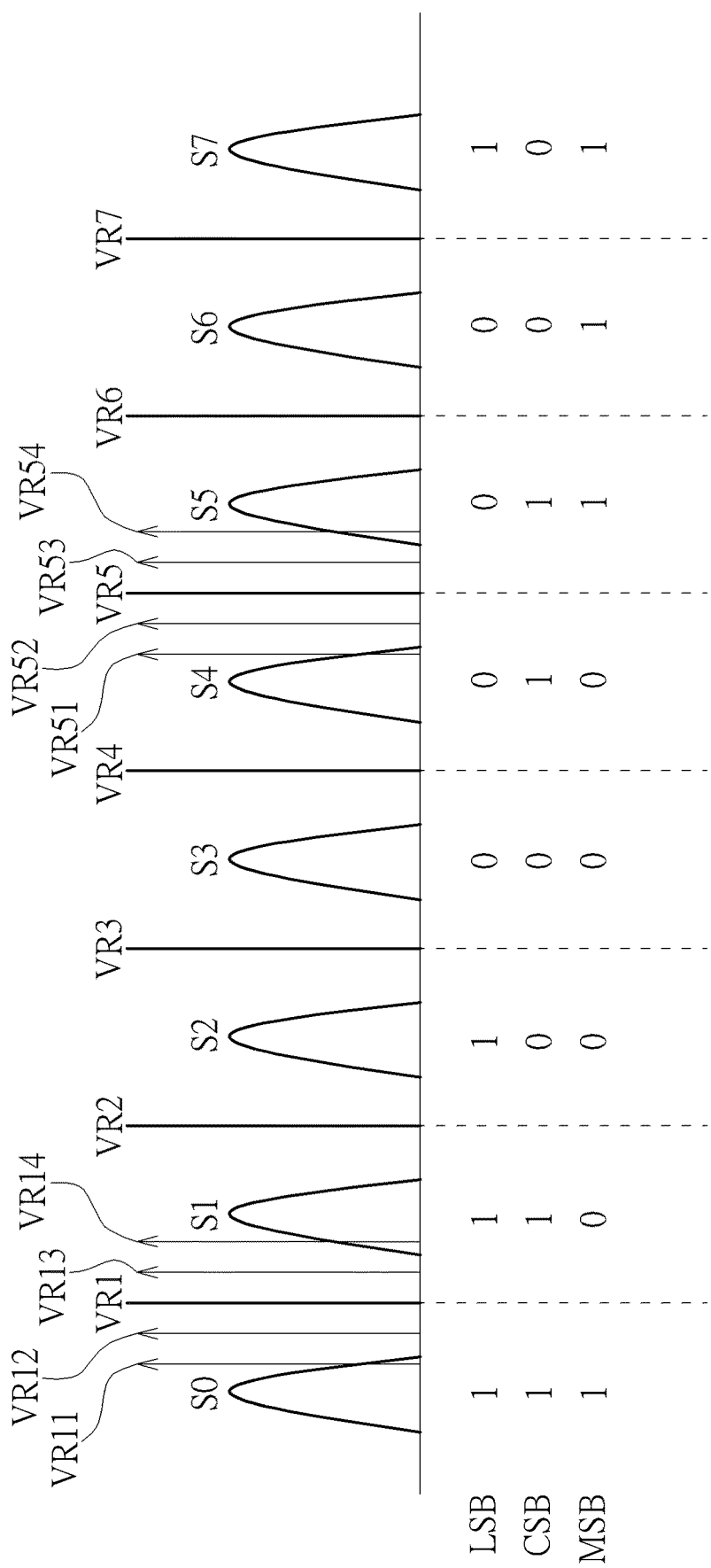
FIG. 6 is a diagram illustrating read voltages for soft decoding method.
Figure 7:
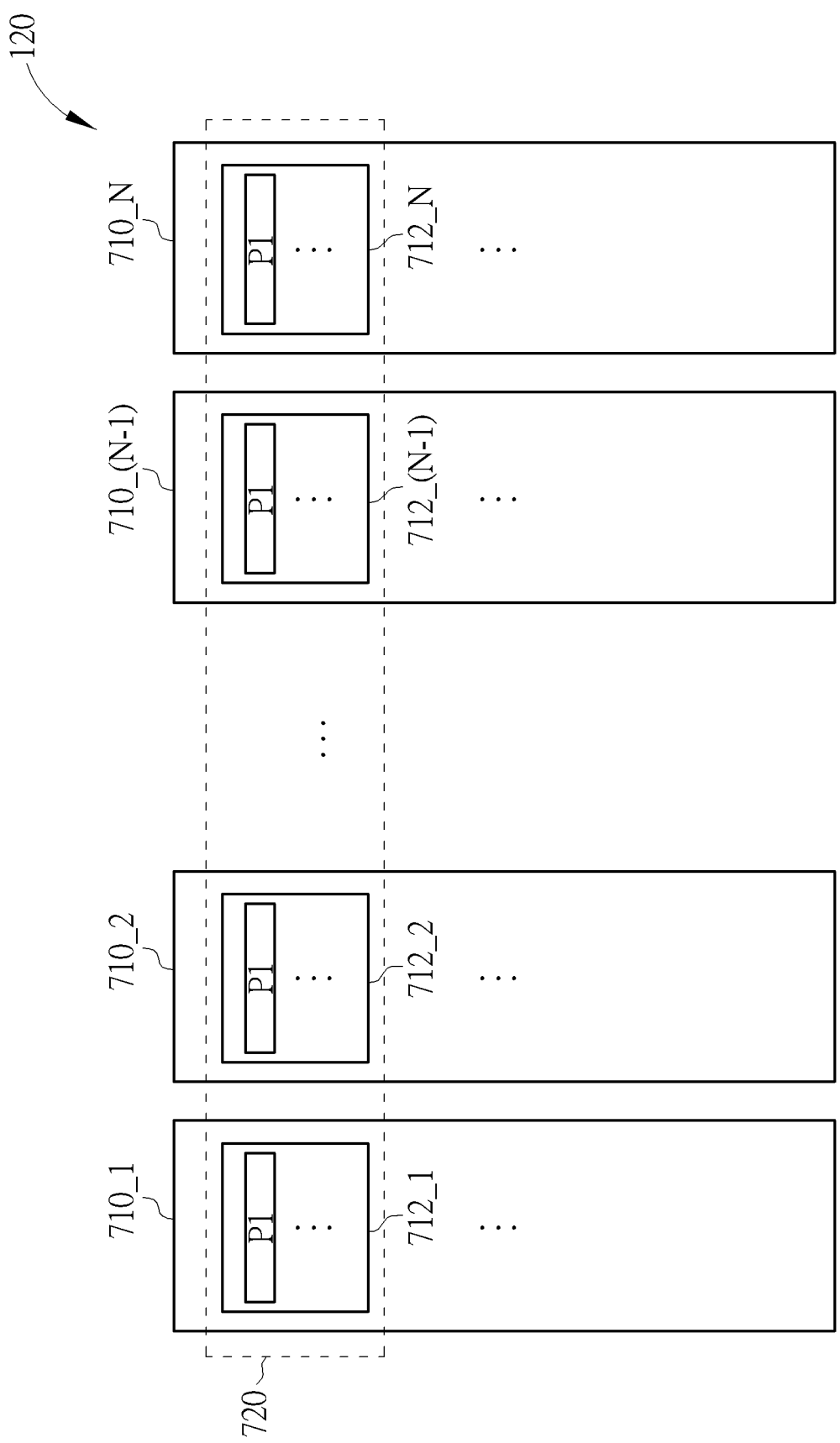
FIG. 7 is a diagram illustrating planes within the flash memory module.

In this embodiment, if the first decoding flow comprising the hard decoding method, the soft decoding method and the RAID decoding method serves as the target decoding flow, the flash memory controller 110 sends a read request to the flash memory module 120, and the flash memory module 120 uses some read voltages to read the memory cells of word line(s) to generate the readout information. For example, assuming that the MSB page of a word line of the specific block is to be read, the read voltage VR1 is applied to the memory cells of the word line to generate first bit for each memory cell, and the read voltage VR5 is applied to the memory cells to generate second bit for each memory cell, and the first bit and second bit of each memory cell of the word line can serves as the readout information. Then, after getting the readout information from the flash memory module 120, the decoder 134 uses the hard decoding method such as Bose-Chaudhuri-Hocquenghem (BCH) to decode the readout information. If the decoder 134 successfully decodes the readout information, the decoding flow is finished; and if the hard decoding method fails to decode the readout information, the flash memory controller 110 sends another read request to the flash memory module 120 to ask for the readout information for the soft decoding method, and the flash memory module 120 uses many read voltages to read the memory cells of word line to generate the readout information. For example, referring to FIG. 6, the flash memory module 120 may use a plurality of read voltages VR1 and VR11-VR14 to read each memory cell of the word line to generate a plurality of first bits, respectively (i.e. five first bits); and the flash memory module 120 may further use a plurality of read voltages VR5 and VR51-VR54 to read each memory cell of the word line to generate a plurality of second bits, respectively (i.e. five second bits). In this embodiment, the first bits and second bits of each memory cell of the word line can serves as the readout information, or a mapping mechanism may be applied to the first bits and second bits of each memory cell to generate the readout information. Then, after getting the readout information from the flash memory module 120, the decoder 134 uses the soft decoding method such as low-density parity-check code (LDPC) decoding method to decode the readout information. If the decoder 134 successfully decodes the readout information by using the soft decoding method, the decoding flow is finished; and if the hard decoding method fails to decode the readout information, the flash memory controller 110 sends another read request to the flash memory module 120 to ask for the readout information for the RAID decoding method, and the flash memory module 120 reads data of other pages within other blocks to generate the readout information. For example, referring to FIG. 7, the flash memory module 120 comprises a plurality of planes 710_1-710_N, and a super block 720 is established by grouping blocks 712_1-712_N respectively being included in the planes 710_1-710_N. In the embodiment shown in FIG. 7, the pages P1 of the blocks 712_1-712_N are configured to store data having (N-1) page size, that is one of the pages P1 of the 712_1-712_N is parity data of the other pages P1, for example, data of the page P1 of the block 712_N is generated by a parity generating mechanism using data of the pages P1 of the blocks 712_1-712_(N-1). In this embodiment, assuming that the page P1 of the block 712_1 corresponds to the word line specific block that is to be read, in response to the read request of the RAID decoding method from the flash memory controller 110, the flash memory module 120 reads the pages P1 of the blocks 712_1-712_N, or the flash memory module 120 reads the pages P1 of the blocks 712_2-712_N to generate the readout information. Then, after getting the readout information from the flash memory module 120, the decoder 134 uses the RAID decoding method to decode the readout information, for example, using the data of the pages P1 of the blocks 712_2-712_N to generate the data of page P1 of the block 712_1. If the decoder 134 successfully decodes the readout information by using the RAID decoding method, the decoding flow is finished; and if the RAID decoding method fails to decode the readout information, the flash memory controller 110 notifies the host device 50 that the read operation fails.

If the second decoding flow comprising the soft decoding method and the RAID decoding method serves as the target decoding flow, the flash memory controller 110 sends a read request to the flash memory module 120, and the flash memory module 120 directly uses many read voltages to read the memory cells of word line to generate the readout information as mentioned above. Then, after getting the readout information from the flash memory module 120, the decoder 134 directly uses the soft decoding method such as LDPC decoding method to decode the readout information (i.e., no hard decoding method is performed firstly). If the decoder 134 successfully decodes the readout information by using the soft decoding method, the decoding flow is finished; and if the hard decoding method fails to decode the readout information, the flash memory controller 110 sends another read request to the flash memory module 120 to ask for the readout information for the RAID decoding method, and the flash memory module 120 reads data of other pages within other blocks to generate the readout information as mentioned above. Then, after getting the readout information from the flash memory module 120, the decoder 134 uses the RAID decoding method to decode the readout information. If the decoder 134 successfully decodes the readout information by using the RAID decoding method, the decoding flow is finished; and if the RAID decoding method fails to decode the readout information, the flash memory controller 110 notifies the host device 50 that the read operation fails.

If the third decoding flow comprising only the RAID decoding method serves as the target decoding flow, the flash memory controller 110 sends a read request to the flash memory module 120, and the flash memory module 120 directly reads data of other pages within other blocks to generate the readout information as mentioned above. Then, after getting the readout information from the flash memory module 120, the decoder 134 directly uses the RAID decoding method to decode the readout information (i.e., no hard decoding method and soft decoding method is performed firstly). If the decoder 134 successfully decodes the readout information by using the RAID decoding method, the decoding flow is finished; and if the RAID decoding method fails to decode the readout information, the flash memory controller 110 notifies the host device 50 that the read operation fails.

Briefly summarized, in the method for accessing the flash memory module of the present invention, by counting state of each memory cell of one or more word line of the specific block to obtain the cumulative distribution information, the flash memory controller can determine an appropriate decoding flow for the subsequent readout information of the specific block. Therefore, the decoder can effectively decode readout information from the flash memory module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, wherein the flash memory module comprises at least one flash memory chip, each flash memory chip comprises a plurality of block, each block is implemented by a plurality of word lines, each word line corresponds to a plurality of pages, each word line comprises a plurality of memory cells supporting a plurality of states, each memory cell is arranged to store a plurality of bits, each state represents different combination of the plurality of bits, and the method comprises the steps of:

reading the memory cells of at least a first word line of a specific block of the plurality of blocks to obtain cumulative distribution information of the states of the memory cells;

determining a target decoding flow selected from at least a first decoding flow and a second decoding flow according to the cumulative distribution information, wherein the first decoding flow and the second decoding flow have different decoding methods or different decoding orders;

reading the memory cells of a second word line to obtain readout information of the second word line; and using the target decoding flow to decode the readout information of the second word line.

2. The method of claim 1, wherein the cumulative distribution information comprises cumulative number/ratio of each state, and the cumulative number/ratio of one of the states comprises the number/ratio of the states whose corresponding programmed voltage is equal to and less than the programmed voltage of the one of the states.

3. The method of claim 1, wherein the step of determining the target decoding flow selected from at least the first decoding flow and the second decoding flow according to the cumulative distribution information comprises:

referring to a difference between the cumulative distribution information and ideal cumulative distribution information to determine the target decoding flow selected from at least the first decoding flow and the second decoding flow.

4. The method of claim 3, wherein the first decoding flow comprising a hard decoding method and a soft decoding method, and the second decoding flow comprises the soft decoding method without the hard decoding method, and the step of referring to the difference between the cumulative distribution information and the ideal cumulative distribution information to determine the target decoding flow selected from at least the first decoding flow and the second decoding flow comprises:

if the difference is lower than a first degree, selecting the first decoding flow as the target decoding flow; and if the difference is greater than the first degree or a second degree, selecting the second decoding flow as the target decoding flow, wherein second degree is greater than the second degree.

5. The method of claim 3, wherein the first decoding flow comprising a soft decoding method and a redundant array of independent disks (RAID) decoding method, and the second decoding flow comprises the RAID decoding method without the soft decoding method, and the step of referring to the difference between the cumulative distribution information and the ideal cumulative distribution information to determine the target decoding flow selected from at least the first decoding flow and the second decoding flow comprises:

if the difference is lower than a first degree, selecting the first decoding flow as the target decoding flow; and if the difference is greater than the first degree or a second degree, selecting the second decoding flow as the target decoding flow, wherein the second degree is greater than the first degree.

6. The method of claim 1, wherein the step of determining the target decoding flow selected from at least the first decoding flow and the second decoding flow according to the cumulative distribution information comprises:

determining the target decoding flow selected from at least the first decoding flow, the second decoding flow and a third decoding flow according to the cumulative distribution information, wherein the first decoding flow, the second decoding flow and the third decoding flow have different decoding methods or different decoding orders.

7. The method of claim 6, wherein the step of determining the target decoding flow selected from at least the first decoding flow, the second decoding flow and the third decoding flow according to the cumulative distribution information comprises:

referring to a difference between the cumulative distribution information and ideal cumulative distribution information to determine the target decoding flow selected from at least the first decoding flow, the second decoding flow and the third decoding flow.

8. The method of claim 7, wherein the first decoding flow comprising a hard decoding method, a soft decoding method and a RAID decoding method, the second decoding flow comprises the soft decoding method and the RAID decoding method without the hard decoding method, and the third decoding flow comprises the RAID decoding method without the hard decoding method and the soft decoding method; and the step of referring to the difference between the cumulative distribution information and the ideal cumulative distribution information to determine the target decoding flow selected from at least the first decoding flow, the second decoding flow and the third decoding flow comprises:

if the difference is lower than a first degree, selecting the first decoding flow as the target decoding flow;

if the difference is greater than a second degree, selecting the third decoding flow as the target decoding flow, wherein second degree is greater than the second degree; and if the difference is between the first degree and the second degree, selecting the second decoding flow as the target decoding flow.

9. A flash memory controller, wherein the flash memory controller is coupled to a flash memory module, the flash memory module comprises at least one flash memory chip, each flash memory chip comprises a plurality of block, each block is implemented by a plurality of word lines, each word line corresponds to a plurality of pages, each word line comprises a plurality of memory cells supporting a plurality of states, each memory cell is arranged to store a plurality of bits, each state represents different combination of the plurality of bits, and the flash memory controller comprising:

a memory, for storing a program code;

a microprocessor, for executing the program code to access the flash memory module via a control logic circuit; and a decoder;

wherein the microprocessor reads the memory cells of at least a first word line of a specific block of the plurality of blocks to obtain a cumulative distribution information of the states of the memory cells, and the microprocessor determines a target decoding flow selected from at least a first decoding flow and a second decoding flow according to the cumulative distribution information, wherein the first decoding flow and the second decoding flow have different decoding methods or different decoding orders; and the microprocessor further reads the memory cells of a second word line to obtain readout information of the second word line, and the decoder uses the target decoding flow to decode the readout information of the second word line.

10. The flash memory controller of claim 9, wherein the cumulative distribution information comprises cumulative number/ratio of each state, and the cumulative number/ratio of one of the states comprises the number/ratio of the states whose corresponding programmed voltage is equal to and less than the programmed voltage of the one of the states.

11. The flash memory controller of claim 9, the microprocessor refers to a difference between the cumulative distribution information and ideal cumulative distribution information to determine the target decoding flow selected from at least the first decoding flow and the second decoding flow.

12. The flash memory controller of claim 11, wherein the first decoding flow comprising a hard decoding method and a soft decoding method, and the second decoding flow comprises the soft decoding method without the hard decoding method; and if the difference is lower than a first degree, he microprocessor selects the first decoding flow as the target decoding flow; and if the difference is greater than the first degree or a second degree, the microprocessor selects the second decoding flow as the target decoding flow, wherein second degree is greater than the second degree.

13. The flash memory controller of claim 11, wherein the first decoding flow comprising a soft decoding method and a redundant array of independent disks (RAID) decoding method, and the second decoding flow comprises the RAID decoding method without the soft decoding method; and if the difference is lower than a first degree, the microprocessor selects the first decoding flow as the target decoding flow; and if the difference is greater than the first degree or a second degree, the microprocessor selects the second decoding flow as the target decoding flow, wherein the second degree is greater than the first degree.

14. The flash memory controller of claim 9, wherein the microprocessor determines the target decoding flow selected from at least the first decoding flow, the second decoding flow and a third decoding flow according to the cumulative distribution information, wherein the first decoding flow, the second decoding flow and the third decoding flow have different decoding methods or different decoding orders.

15. The flash memory controller of claim 14, wherein the microprocessor refers to a difference between the cumulative distribution information and ideal cumulative distribution information to determine the target decoding flow selected from at least the first decoding flow, the second decoding flow and the third decoding flow.

16. The flash memory controller of claim 15, wherein the first decoding flow comprising a hard decoding method, a soft decoding method and a RAID decoding method, the second decoding flow comprises the soft decoding method and the RAID decoding method without the hard decoding method, and the third decoding flow comprises the RAID decoding method without the hard decoding method and the soft decoding method; and if the difference is lower than a first degree, the microprocessor selects the first decoding flow as the target decoding flow; if the difference is greater than a second degree, the microprocessor selects the third decoding flow as the target decoding flow, wherein second degree is greater than the second degree; and if the difference is between the first degree and the second degree, the microprocessor selects the second decoding flow as the target decoding flow.

17. An electronic device, comprising:
a flash memory controller;
a flash memory module, wherein the flash memory module comprises at least one flash memory chip, each flash memory chip comprises a plurality of block, each block is implemented by a plurality of word lines, each word line corresponds to a plurality of pages, each word line comprises a plurality of memory cells supporting a plurality of states, each memory cell is arranged to store a plurality of bits, each state represents different combination of the plurality of bits;
wherein the flash memory controller reads the memory cells of at least a first word line of a specific block of the plurality of blocks to obtain a cumulative distribution information of the states of the memory cells, and the flash memory controller determines a target decoding flow selected from at least a first decoding flow and a second decoding flow according to the cumulative distribution information, wherein the first decoding flow and the second decoding flow have different decoding methods or different decoding orders; and the flash memory controller further reads the memory cells of a second word line to obtain readout information of the second word line, and the flash memory controller uses the target decoding flow to decode the readout information of the second word line.

18. The electronic device of claim 17, wherein the flash memory controller determines the target decoding flow selected from at least the first decoding flow, the second decoding flow and a third decoding flow according to the cumulative distribution information, wherein the first decoding flow, the second decoding flow and the third decoding flow have different decoding methods or different decoding orders.

19. The electronic device of claim 18, wherein the flash memory controller refers to a difference between the cumulative distribution information and ideal cumulative distribution information to determine the target decoding flow selected from at least the first decoding flow, the second decoding flow and the third decoding flow.

20. The electronic device of claim 19, wherein the first decoding flow comprising a hard decoding method, a soft decoding method and a RAID decoding method, the second decoding flow comprises the soft decoding method and the RAID decoding method without the hard decoding method, and the third decoding flow comprises the RAID decoding method without the hard decoding method and the soft decoding method; and if the difference is lower than a first degree, the flash memory controller selects the first decoding flow as the target decoding flow; if the difference is greater than a second degree, the flash memory controller selects the third decoding flow as the target decoding flow, wherein second degree is greater than the second degree; and if the difference is between the first degree and the second degree, the flash memory controller selects the second decoding flow as the target decoding flow.

* * * * *